(12) United States Patent
Ohama (10) Patent No.: US 8,555,674 B2
(45) Date of Patent: Oct. 15, 2013

(54) QUARTZ GLASS CRUCIBLE FOR SILICON SINGLE CRYSTAL PULLING OPERATION AND PROCESS FOR MANUFACTURING THE SAME

(75) Inventor: Yasuo Ohama, Echizen (JP)

(73) Assignees: Heraeus Quarzglas GmbH & Co. KG, Hanau (DE); Shin-Etsu Quartz Products Co., Ltd., Tokyo (JP)

( * ) Notice: Subject to any disclaimer, the term of this patent is extended or adjusted under 35 U.S.C. 154(b) by 985 days.

(21) Appl. No.: 12/451,753

(22) PCT Filed: May 23, 2008

(86) PCT No.: PCT/JP2008/059964
§ 371 (c)(1),
(2), (4) Date: Dec. 3, 2009

(87) PCT Pub. No.: WO2008/149781
PCT Pub. Date: Dec. 11, 2008

(65) Prior Publication Data
US 2010/0132609 A1   Jun. 3, 2010

(30) Foreign Application Priority Data

May 31, 2007   (JP) ................................. 2007-144650

(51) Int. Cl.
*C30B 15/10* (2006.01)
(52) U.S. Cl.
USPC .................. 65/60.1; 65/60.5; 65/63; 117/200; 117/900
(58) Field of Classification Search
USPC ........ 65/60.1, 60.5, 63, DIG. 8; 117/200, 900
See application file for complete search history.

(56) References Cited

U.S. PATENT DOCUMENTS

| | | | |
|---|---|---|---|
| 3,837,825 A * | 9/1974 | Loxley et al. | 264/662 |
| 4,416,680 A | 11/1983 | Brüning et al. | |
| 4,759,787 A * | 7/1988 | Winterburn | 65/30.1 |
| 4,979,973 A | 12/1990 | Takita et al. | |
| 5,976,247 A | 11/1999 | Hansen et al. | |
| 6,546,754 B1 * | 4/2003 | Hansen et al. | 65/144 |
| 2004/0112274 A1 | 6/2004 | Tsujimoto et al. | |

(Continued)

FOREIGN PATENT DOCUMENTS

| | | |
|---|---|---|
| EP | 0360659 A1 | 3/1990 |
| EP | 1408015 A2 | 4/2004 |

(Continued)

OTHER PUBLICATIONS

Patent Abstracts of Japan, English Abstract of JP 03-088792 (2013).*

(Continued)

*Primary Examiner* — Matthew Song
(74) *Attorney, Agent, or Firm* — Tiajoloff and Kelly LLP (57) ABSTRACT

A quartz glass crucible for silicon single crystal pulling operation that by a simple arrangement, attains prevention of any collapse onto the inside at a superior edge of straight trunk part; and a process for manufacturing the same. The quartz glass crucible for silicon single crystal pulling operation having a straight trunk part and a bottom part, is characterized in that at least the straight trunk part is provided with a gradient of fictive temperature so that the fictive temperature on the outermost side thereof is 25° C. or more lower than the fictive temperature on the innermost side thereof.

9 Claims, 3 Drawing Sheets

(56) References Cited

U.S. PATENT DOCUMENTS

| | | |
|---|---|---|
| 2007/0102133 A1 | 5/2007 | Kemmochi et al. |
| 2008/0066497 A1 * | 3/2008 | Weber et al. ............ 65/17.6 |
| 2008/0078207 A1 | 4/2008 | Tsujimoto et al. |

FOREIGN PATENT DOCUMENTS

| | | | |
|---|---|---|---|
| EP | 1785401 A1 | | 5/2007 |
| EP | 1985593 A2 | | 10/2008 |
| JP | 03088792 A | * | 4/1991 |
| JP | H07-330358 | | 12/1995 |
| JP | 8002932 A | | 1/1996 |
| JP | 9110590 A | | 4/1997 |
| JP | 2001-026494 | | 1/2001 |
| JP | 2001026494 A | | 1/2001 |
| JP | 2002047092 A | | 2/2002 |
| JP | 2004131317 A | | 4/2004 |
| JP | 2004155642 A | | 6/2004 |
| JP | 2005041723 A | | 2/2005 |
| JP | 2006089301 A | | 4/2006 |
| JP | 2006096616 A | | 4/2006 |

OTHER PUBLICATIONS

Patent Abstracts of Japan, English Abstract and Computer translation of of JP 2001-026494(2013).*

Espacenet English language abstract for JP 8002932 A published Jan. 9, 1996.

Espacenet English language abstract for JP 9110590 A published Apr. 28, 1997.

Espacenet English language abstract for JP 2004131317 A published Apr. 30, 2004.

Espacenet English language abstract for JP 2006096616 A published Apr. 13, 2006.

Espacenet English language abstract for JP 2002047092 A published Feb. 12, 2002.

Espacenet English language abstract for JP 2005041723 A published Feb. 17, 2005.

Espacenet English language abstract for JP 2001026494 A published Jan. 30, 2001.

Espacenet English language abstract for JP 2004155642 A published Jun. 3, 2004.

Espacenet English language abstract for JP 2006089301 A published Apr. 6, 2006.

Espacenet English language abstract of JP 2001-026494 A, Jan. 30, 2001.

Espacenet English language abstract of JP H07-330358 A, Dec. 19, 1995.

EPO Patent Abstracts of Japan, JP 2001026494 A.

EPO Patent Abstracts of Japan, JP H07330358 A.

* cited by examiner

QUARTZ GLASS CRUCIBLE FOR SILICON SINGLE CRYSTAL PULLING OPERATION AND PROCESS FOR MANUFACTURING THE SAME

TECHNICAL FIELD

The present invention relates to a quartz glass crucible for pulling a silicon single crystal and method of producing same.

PRIOR ART

A method known as the Czochralski method (CZ method), in which silicon polycrystals are fused inside a crucible made of quartz glass, a seed crystal is dipped in this silicon melt, the seed crystal is gradually pulled up while the crucible is rotated, and a silicon single crystal is grown, is widely used in the conventional production of silicon single crystals for semiconductor production.

A quartz glass crucible for pulling a silicon single crystal is generally configured by a transparent inner layer and an opaque outer layer which contains cells, but it is known that the outer layer which contains cells is more likely to expand than the inner layer due to the heat load when the single crystal is pulled, and the straight body part which is not pressed by the silicon melt falls inwards due to this expansion differential.

As silicon wafers have become larger in recent years, so the quartz glass crucibles used have also become larger, and this has brought with it an increase in the amount of polycrystalline raw material charge, and because the heater is at a distance from the silicon single crystal which is grown, the operating time has lengthened, the power output from the heater has increased, and the heat load on the quartz glass crucible has increased. Furthermore, the heat load for quartz glass crucibles has tended to increase even for conventional 6" and 8" single crystal pulling, compared with previously, because of efforts to improve productivity and quality. As a result, attention has focused on the problem whereby the cylindrical part of the quartz glass crucible falls inwards due to the heat load, regardless of the size of the crucible.

Methods in which a glass surface is crystallized (Japanese Unexamined Patent Application Publication H8-2932, Japanese Unexamined Patent Application Publication H9-110590, Japanese Unexamined Patent Application Publication 2004-131317), and a method in which an annular member is embedded (Japanese Unexamined Patent Application Publication 2006-96616) have been proposed to deal with the deformation, but the anticipated costs of these are high, which is undesirable.

Furthermore, Japanese Unexamined Patent Application Publication 2002-47092 proposes measures to deal with deformation in which the thickness of the straight body part and the viscosity coefficient are appropriately set, and Japanese Unexamined Patent Application Publication 2005-41723 proposes a thick configuration, but when the thickness is changed, the quality of the crystals may be affected, and this cannot be applied to all processes.

Japanese Unexamined Patent Application Publication H8-2932
Japanese Unexamined Patent Application Publication H9-110590
Japanese Unexamined Patent Application Publication 2004-131317
Japanese Unexamined Patent Application Publication 2006-96616
Japanese Unexamined Patent Application Publication 2002-47092
Japanese Unexamined Patent Application Publication 2005-41723

DISCLOSURE OF THE INVENTION

Problems to be Resolved by the Invention

In this regard, the present invention aims to provide a quartz glass crucible for pulling a silicon single crystal which has a simple configuration and with which it is possible to prevent the upper end of the straight body part from falling inwards, and a method for the production thereof.

Means of Resolving the Problems

The aim mentioned above is achieved by means of a quartz glass crucible for pulling a silicon single crystal and method of producing same, which have the configuration given in (1) to (7) below of the present invention.

(1) Quartz glass crucible for pulling a silicon single crystal, comprising a straight body part and a bottom part, said quartz glass crucible for pulling a silicon single crystal being characterized in that a fictive temperature gradient is formed on at least the abovementioned straight body part, and the outermost fictive temperature is made to be at least 25° C. lower than the innermost fictive temperature.

(2) Quartz glass crucible for pulling a silicon single crystal according to (1) above, in which the outermost fictive temperature is made to be at least 50° C. lower than the innermost fictive temperature.

(3) Method of producing a quartz glass crucible for pulling a silicon single crystal, characterized in that the crucible is fused, after which said outside fictive temperature is lowered by holding the crucible inside a mould and maintaining the temperature of the outside of the crucible for a prescribed period of time, so as to form a fictive temperature gradient on at least the abovementioned straight body part, the outermost fictive temperature being made to be at least 25° C. lower than the innermost fictive temperature.

(4) Method of producing a quartz glass crucible for pulling a silicon single crystal according to (3) above, in which a graphite mould is used, and the crucible is fused, after which a prescribed amount of residual powder is removed, and the temperature of the outside of the crucible is maintained for a prescribed period of time by residual heat from the abovementioned graphite mould.

(5) Method of producing a quartz glass crucible for pulling a silicon single crystal according to (3) above, in which use is made of a metallic mould of which the outside is cooled with cooling water, and after the crucible has been fused leaving a residual powder layer of at least 3 mm but no more than 10 mm on at least the straight body part, the residual powder is not removed, and the temperature of the outside of the crucible is maintained for a prescribed period of time by the residual heat of said residual powder.

(6) Method of producing a quartz glass crucible for pulling a silicon single crystal according to any of (3) to (5) above, characterized in that the crucible is fused, after which said inside fictive temperature is raised by forced cooling of the inside of the crucible together with maintaining of the temperature of the outside of the abovementioned crucible, so as to form a fictive temperature gradient on at least the abovementioned straight body part, the outermost fictive temperature being made to be at least 25° C. lower than the innermost fictive temperature.

(7) Method of producing a quartz glass crucible for pulling a silicon single crystal according to (6) above, in which the abovementioned forced cooling is carried out by spraying gas and ultra-pure water.

Effect of the Invention

With the quartz glass crucible for pulling a silicon single crystal according to the present invention, a outermost fictive temperature is set to be lower than an innermost fictive temperature on at least the straight body part, and therefore the thermal expansion coefficient of the glass itself and the difference in density serve to counteract the abovementioned falling inwards. Accordingly, with the quartz glass crucible for pulling a silicon single crystal according to the present invention, it is possible to prevent the falling inwards that is seen with conventional crucibles.

The fictive temperature gradient in the quartz glass crucible for pulling a silicon single crystal according to the present invention can be formed when the crucible is produced by a simple operation in which the crucible is fused, after which the crucible is held inside a mould, and the temperature of the outside thereof is maintained, while the inside of the crucible is sharply cooled.

OPTIMUM MODE OF EMBODIMENT OF THE INVENTION

A mode of embodiment of the quartz glass crucible for pulling a silicon single crystal will be described in detail below, with reference to the appended figures.

Figure 1:
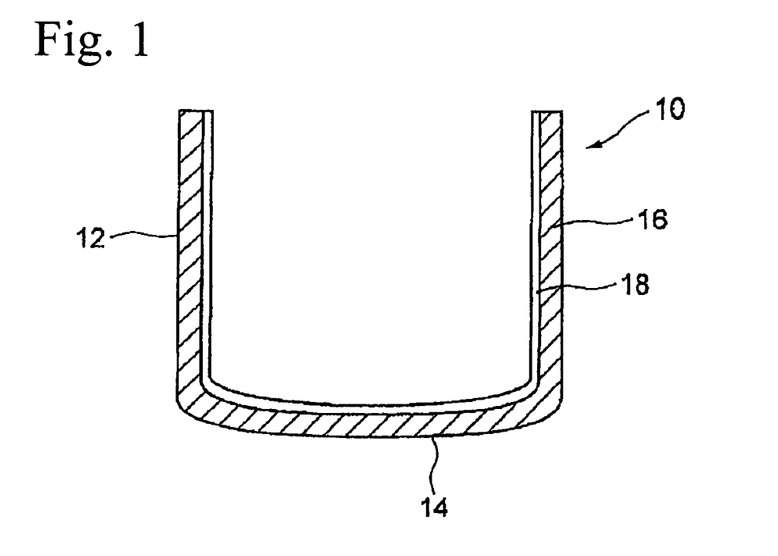
FIG. 1 is a schematic in cross section of the quartz glass crucible for pulling a silicon single crystal according to an inventive mode of embodiment.

FIG. 1 is a schematic in cross section of a quartz glass crucible 10 for pulling a silicon single crystal according to a mode of embodiment of the present invention. Said quartz glass crucible 10 for pulling a silicon single crystal has the basic form shown in FIG. 1 and comprises a straight body part 12 and a bottom part 14, the same as a normal crucible. Furthermore, the layer structure comprises an outer layer part 16 which is a translucent glass layer containing a large number of cells, and an inner layer part 18 which is a transparent quartz glass layer which has no cells, which has a smooth surface, and which is formed on the inner surface of said outer layer part 16.

No limitation is imposed on this quartz glass crucible 10 for pulling a silicon single crystal, but the diameter is preferably at least 24 inches, more particularly at least 32 inches.

With this quartz glass crucible 10 for pulling a silicon single crystal, a fictive temperature gradient is formed on at least the abovementioned straight body part 12, and the outermost fictive temperature is made to be at least 25° C. lower than the innermost fictive temperature. The difference between said outermost and innermost fictive temperatures is preferably at least 50° C. If the difference between the outermost and innermost fictive temperatures is less than 25° C., there is a risk that the intrinsic action of preventing the upper end of the crucible from falling inwards cannot be adequately achieved.

No particular upper limit is imposed on the difference between the outermost and innermost fictive temperatures, but it is difficult to make it any higher than 150° C. in view of the thickness of the crucible.

A description will be given next of the method of production of the quartz glass crucible 10 for pulling a silicon single crystal described above. The method of producing the quartz glass crucible 10 for pulling a silicon single crystal comprises a step of producing a fused crucible 40, and a temperature-maintaining step in which the temperature of the outside thereof is maintained in order to form a fictive temperature gradient on the crucible (or a cooling step in which the inside of the crucible is subjected to forced cooling at the same time as the temperature-maintaining step is carried out on the outside thereof).

Figure 2:
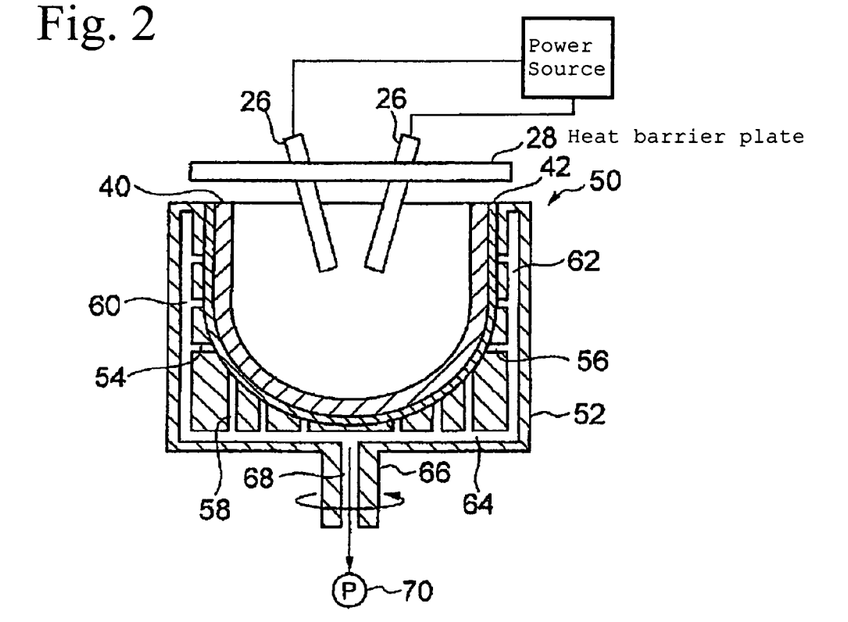
FIG. 2 is a schematic in cross section of the device for producing the quartz glass crucible for pulling a silicon single crystal shown in FIG. 1.

The step of producing the fused crucible 40 is carried out using the device 50 shown in FIG. 2. That is, natural silica powder and then synthetic silica powder are supplied from a raw material supply means (not depicted) to a rotating graphite mould 52 to mould the shape of the crucible, after which arc electrodes 26 are inserted therein, electrical discharge is started, and also suction using a pump 70 is started. The mould 52 is provided with open air channels 54, 56, 58 on the inner surface of the mould, multibranch pipes 60, 62, 64 which link in communication with said air channels 54, 56, 58 (the multibranch pipes 60, 62 link in communication with the multibranch pipe 64), and an outlet flow channel 68 provided with a rotary shaft 66 and connected to the pump 70; until the inner layer part 18 which is a transparent quartz glass layer is formed on the inner surface of the crucible, suction is carried out by means of the operation of the pump 70. Once an inner layer part 18 of the desired thickness has been obtained, suction by the pump is stopped, or weakened, whereby the outer layer part 16 comprising translucent glass is thereafter formed, and the fused crucible 40 is produced.

Next, the arc electrical discharge is stopped, and we move to the temperature-maintaining step. In the temperature-maintaining step, a gas (preferably an inert gas such as nitrogen gas) is introduced via the abovementioned outlet flow channel 68, the multibranch pipes 60, 62, 64 and the air channels 54, 56, 58, and said gas is then sprayed onto a residual powder layer 42 between the fused crucible 40 and the mould 52, a prescribed amount of residual powder is removed, and the temperature of the outside of the fused crucible 40 is maintained for a prescribed period of time by means of the residual heat of the graphite mould 52. The amount of the abovementioned residual powder which is removed may be of a degree such that the fused crucible 40 can still be extracted due to contraction of the mould 52, and this depends on the fusion conditions and the size of the crucible, but around 20-80% of the overall residual powder is generally removed. The time for which the temperature is maintained (the prescribed time referred to above) depends on the size of the crucible etc., but it is of the order of 10-60 minutes. The portion of the fused crucible where the temperature is maintained by means of the graphite mould is denoted by the reference symbol 40b in FIG. 3.

Here, the graphite mould after fusion has finished expands outwards due to the heat of fusion, but it contracts inwards as the arcing is stopped. When the mould is large, the contraction takes place in units of several mm, whereas the fused crucible 40 does not undergo contraction for the most part, and therefore if it is held in that state, the fused crucible cannot be extracted, and in the worst case it may break due to the contraction rate differential, and therefore it is generally extracted from the mould 52 before this. In the present invention, a prescribed amount of residual powder 42 between the fused crucible 40 and the mould 52 is removed by supplying gas from the abovementioned outlet flow channel 68, and a space which fills the contraction differential is provided, which makes it possible to hold the fused crucible 40 inside the mould 52.

Figure 4:
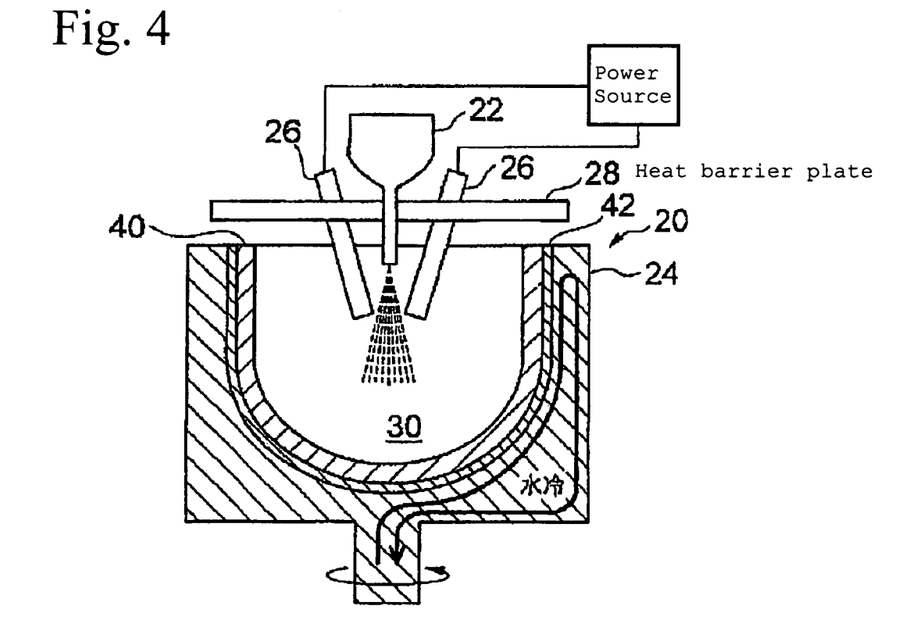
FIG. 4 is a schematic in cross section of another device for producing the quartz glass crucible for pulling a silicon single crystal shown in FIG. 1.

The fused crucible 40 may be produced using the device 20 shown in FIG. 4. That is to say, natural silica powder is introduced to a rotating metallic (generally stainless steel) mould 24 from raw material powder supply means (not depicted), and the shape of the crucible is moulded, after which arc electrodes 26 are inserted therein, and the open part of the crucible-shaped moulded body is covered by a heat barrier plate 28; the cavity inside said crucible-shaped moulded body is subjected to a high-temperature atmosphere 30 by means of the arc electrodes 26, causing at least partial fusion of the glass so as to form an opaque crucible base, i.e. the outer layer part 16, and then synthetic silica powder is supplied from the raw material powder supply means 22 to the high-temperature atmosphere 30 to form the inner layer part 18 which is a transparent layer of fused glass comprising synthetic quartz glass, whereby the fused crucible 40 is produced. When this fused crucible 40 is produced, the production (fusion) conditions are set so that a residual powder layer 42 of at least 3 mm but no more than 10 mm remains between the fused crucible 40 and the mould 24 on at least the straight body part. At this time, the mould 24 is cooled with cooling water in order to prevent heat deformation.

The temperature-maintaining step when the fused crucible 40 is produced using the device 20 shown in FIG. 4 is carried out by providing cooling for a prescribed amount of time, with the abovementioned residual powder layer 42 remaining as it is. The residual powder layer 42 contains air, and therefore it is unlikely to be subject to the cooling effect produced by the cooling water on the outside of the mould and it has good heat-retention properties, and therefore the outside of the crucible is slow to cool, and the outside fictive temperature is lower than the inside fictive temperature. If the residual powder layer 42 is less than 3 mm, an adequate temperature-maintaining effect cannot be achieved by the effects of the cooling water, and if it exceeds 10 mm it is difficult to control the dimensions of the crucible. The portion of the fused crucible where the temperature has been maintained by mean of the residual powder is denoted by the reference symbol 40b in FIG. 5. At this time, the time for which the temperature is maintained (prescribed time) depends on the size etc. of the crucible, but it is of the order of 20 to 60 minutes.

The mould 24 which has been cooled by water is not subjected to heat expansion and contraction, and therefore it is unnecessary to extract the fused crucible 40 immediately, and the temperature-maintaining effect can be enhanced using the residual powder layer 42 by adjusting the fusion conditions so that the residual powder layer on the straight body part is at least 3 mm but no more than 10 mm.

When the fused crucible 40 is produced using either the abovementioned device 50 shown in FIG. 2 or the device 20 shown in FIG. 4, in both cases a cooling step for forced cooling of the inside of the crucible which is carried out at the same time as said temperature-maintaining step may be provided in addition to the abovementioned temperature-maintaining step.

Figure 3:
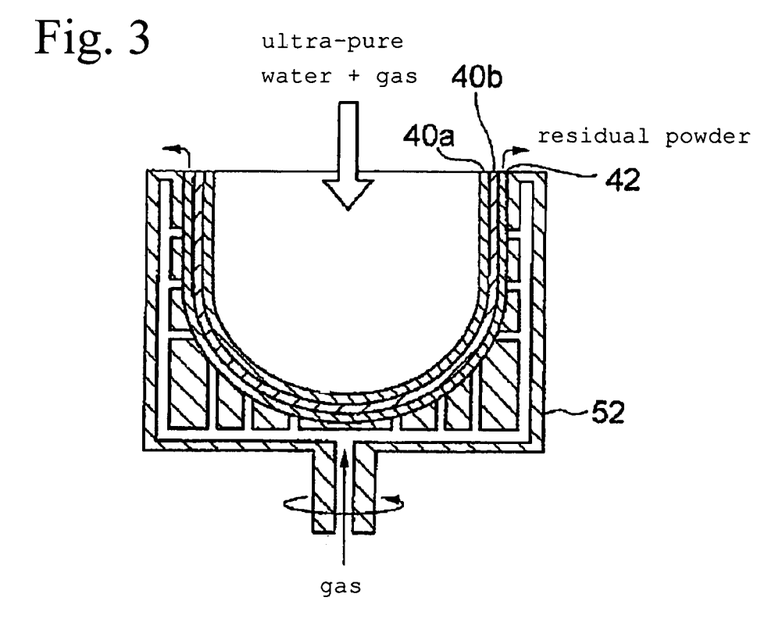
FIG. 3 is a schematic in cross section to illustrate the method of applying a fictive temperature gradient to the crucible.
Figure 5:
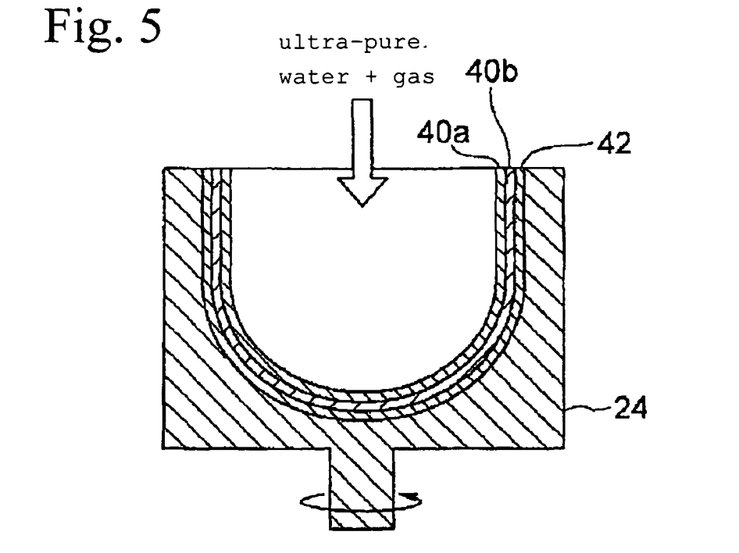
FIG. 5 is a schematic in cross section to illustrate the method of applying a fictive temperature gradient to the crucible.

In this cooling step, after the fusion of the crucible, gas and ultra-pure water are sprayed onto the inner surface (in particular the straight body part) of the fused crucible 40, as shown in FIGS. 3 and 5, for example. An inert gas such as nitrogen, or filtered air (preferred in terms of cost) or the like is preferably used as the gas, and ultra-pure water with a resistance value of 17 MΩ·cm or more and no more than 50 particles of 0.2 μm or more per ml is preferably used.

The optimum conditions for the abovementioned forced cooling conditions vary according to the size of the crucible, but the amount of gas used which is introduced is preferably 10-100 m$^3$/minute, and the amount of ultra-pure water supplied is preferably 0.01-0.5 L/minute. Furthermore, the ultra-pure water has a greater effect if it is supplied by spraying.

The portion of the crucible where forced cooling is carried out is denoted by the reference symbol 40a in FIG. 3 and FIG. 5.

Figure 6:
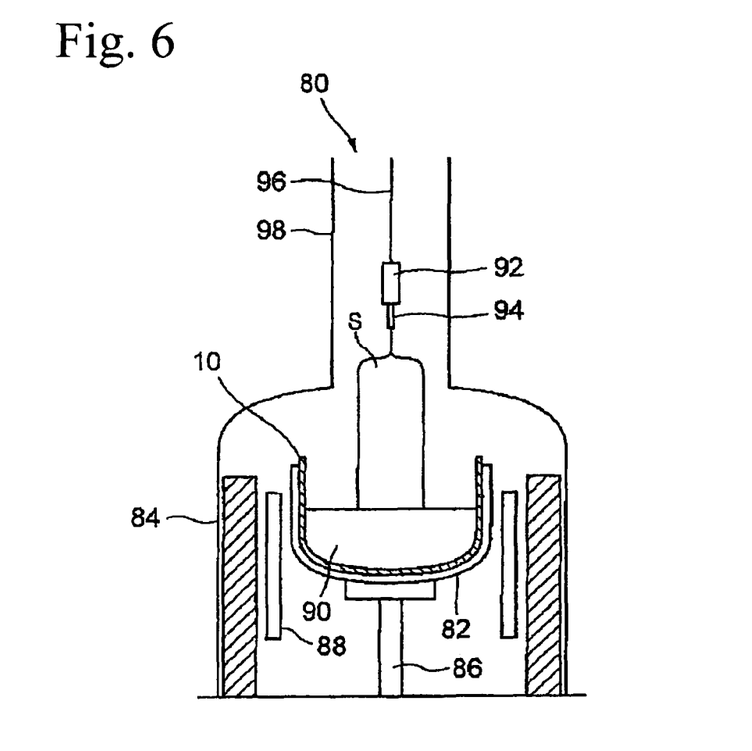

The quartz glass crucible 10 for pulling a silicon single crystal pertaining to the inventive mode of embodiment described above is protected by means of a carbon susceptor 82 in a silicon single crystal production device 80 like that shown in FIG. 6, for example, and it is supported inside a main chamber 84 by a support shaft 86 which can be rotated and raised by means of a crucible drive mechanism (not depicted). Polycrystalline silicon raw material is then fused in the quartz glass crucible 10 for pulling a silicon single crystal by heating using a heater 88 to form a raw material melt 90, and a seed crystal 94 which is held on a seed holder 92 is brought into contact with the raw material melt 90, after which it is pulled up while being rotated by means of a wire 96, whereby a silicon single crystal S is grown. The silicon single crystal S which is grown is then received in a pulling chamber 98 which is linked to the main chamber 84, and extracted.

EXEMPLARY EMBODIMENTS

The present invention will be described in more specific terms below with the aid of exemplary embodiments and comparative examples, but the present invention is not limited by these.

Exemplary Embodiment 1

First of all, the method described above was carried out using the device 50 shown in FIG. 2, and a fused crucible 40 of diameter 24 inches, in which the thickness of the straight body part was 12 mm, was produced.

After this, the residual powder layer 42 of quartz powder remaining between the graphite mould 52 and the fused crucible 40 was treated in the manner described above, with nitrogen gas being sprayed and about 40% of the overall residual powder was removed, and the fused crucible 40 was held inside the mould for 30 minutes. In addition to this and at the same time, 0.04 L/minute of ultra-pure water and 10 m$^3$/minute of nitrogen gas were sprayed for 20 minutes onto the inside of the fused crucible 40 to cool the inside of the crucible. After this, the crucible which had been produced was extracted from the graphite mould 52 and the quartz glass crucible for pulling a silicon single crystal of Exemplary Embodiment 1 was obtained.

The outermost and innermost fictive temperatures of the straight body part of the crucible of Exemplary Embodiment 1 were measured. For the innermost fictive temperature of the crucible, a measurement was taken of a portion 30% of the thickness through from the inner surface of the crucible, while for the outermost fictive temperature of the crucible, a measurement was taken of a portion 30% of the thickness through from the outer surface of the crucible (and likewise below). The Raman scattering spectral intensity method disclosed in A. E. Geissberger and F. L. Galeener, Phys. Rev. B 28, 3266-3271 (1983) was used as the method for measuring the fictive temperature (and likewise below).

As a result, the innermost fictive temperature was 1265° C., and the outermost fictive temperature was 1210° C., and the fictive temperature difference was 55° C.

The quartz glass crucible for pulling a silicon single crystal of Exemplary Embodiment 1 was inserted into the silicon single crystal production device shown in FIG. 6, 150 kg of silicon polycrystalline raw material was loaded into said crucible, and a silicon single crystal having a diameter of 200 mm was pulled. The results are shown in Table 1.

Exemplary Embodiment 2

First of all, the method described above was carried out using the device 50 shown in FIG. 2, and a fused crucible 40 of diameter 24 inches, in which the thickness of the straight body part was 12 mm, was produced.

After this, the residual powder layer 42 of quartz powder remaining between the graphite mould 52 and the fused crucible 40 was treated in the manner described above, with nitrogen gas being sprayed and about 40% of the overall residual powder was removed, and the fused crucible 40 was held inside the mould for 30 minutes. Moreover, the inside of the fused crucible 40 was not subjected to forced cooling, and was left to cool in the air without other intervention. After this, the crucible which had been produced was extracted from the graphite mould 52 and the quartz glass crucible for pulling a silicon single crystal of Exemplary Embodiment 2 was obtained.

When the outermost and innermost fictive temperatures of the straight body part of the crucible of Exemplary Embodiment 2 were measured, the innermost fictive temperature was 1235° C., and the outermost fictive temperature was 1200° C., and the fictive temperature difference was 35° C.

The quartz glass crucible for pulling a silicon single crystal of Exemplary Embodiment 2 was inserted into the silicon single crystal production device shown in FIG. 6, 150 kg of silicon polycrystalline raw material was loaded into said crucible, and a silicon single crystal having a diameter of 200 mm was pulled. The results are shown in Table 1.

Exemplary Embodiment 3

First of all, the method described above was carried out using the device 20 shown in FIG. 4, and a fused crucible 40 of diameter 32 inches, in which the thickness of the straight body part was 16 mm, was produced. At this time, the crucible fusion conditions were set so that the thickness of the residual powder layer 42 was 4 mm. When the thickness of the residual powder layer 42 of the straight body part was obtained by subtracting the outer diameter of the fused crucible 40 from the inner diameter of the stainless-steel mould 24 (and likewise below) it was 4 mm.

After this, the residual powder layer 42 of quartz powder remaining between the stainless-steel mould 24 and the fused crucible 40 was not removed, and the fused crucible 40 was held inside the mould for 30 minutes. In addition to this and at the same time, 0.2 L/minute of ultra-pure water and 60 m³/minute of filtered air were sprayed for 30 minutes onto the inside of the fused crucible 40 to cool the inside of the crucible. After this, the crucible which had been produced was extracted from the mould 24 and the quartz glass crucible for pulling a silicon single crystal of Exemplary Embodiment 3 was obtained.

When the outermost and innermost fictive temperatures of the straight body part of the crucible of Exemplary Embodiment 3 were measured, the innermost fictive temperature was 1230° C., and the outermost fictive temperature was 1150° C., and the fictive temperature difference was 80° C.

The quartz glass crucible for pulling a silicon single crystal of Exemplary Embodiment 3 was inserted into the silicon single crystal production device shown in FIG. 6, 300 kg of silicon polycrystalline raw material was loaded into said crucible, and a silicon single crystal having a diameter of 300 mm was pulled. The results are shown in Table 1.

Exemplary Embodiment 4

First of all, the method described above was carried out using the device 20 shown in FIG. 4, and a fused crucible 40 of diameter 32 inches, in which the thickness of the straight body part was 16 mm, was produced. At this time, the crucible fusion conditions were set so that the thickness of the residual powder layer 42 was 5 mm. The thickness of the residual powder layer 42 of the straight body part was 5 mm.

After this, the residual powder layer 42 of quartz powder remaining between the stainless-steel mould 24 and the fused crucible 40 was not removed, and the fused crucible 40 was held inside the mould for 30 minutes. Moreover, the inside of the fused crucible 40 was not subjected to forced cooling, and was left to cool in the air without other intervention. After this, the crucible which had been produced was extracted from the mould 24 and the quartz glass crucible for pulling a silicon single crystal of Exemplary Embodiment 4 was obtained.

When the outermost and innermost fictive temperatures of the straight body part of the crucible of Exemplary Embodiment 4 were measured, the innermost fictive temperature was 1185° C., and the outermost fictive temperature was 1145° C., and the fictive temperature difference was 40° C.

The quartz glass crucible for pulling a silicon single crystal of Exemplary Embodiment 4 was inserted into the silicon single crystal production device shown in FIG. 6, 300 kg of silicon polycrystalline raw material was loaded into said crucible, and a silicon single crystal having a diameter of 300 mm was pulled. The results are shown in Table 1.

Comparative Example 1

First of all, the method described above was carried out using the device 50 shown in FIG. 2, and a fused crucible 40 of diameter 24 inches, in which the thickness of the straight body part was 12 mm, was produced.

Immediately afterwards the fused crucible 40 was extracted from the graphite mould 52, cooled in the air, and the quartz glass crucible for pulling a silicon single crystal of Comparative Example 1 was obtained.

When the outermost and innermost fictive temperatures of the straight body part of the crucible of Comparative Example 1 were measured, the innermost fictive temperature was 1245° C., and the outermost fictive temperature was 1240° C., and the fictive temperature difference was 5° C.

The quartz glass crucible for pulling a silicon single crystal of Comparative Example 1 was inserted into the silicon single crystal production device shown in FIG. 6, 150 kg of silicon polycrystalline raw material was loaded into said crucible, and a silicon single crystal having a diameter of 200 mm was pulled. The results are shown in Table 1.

Comparative Example 2

First of all, the method described above was carried out using the device 50 shown in FIG. 2, and a fused crucible 40 of diameter 24 inches, in which the thickness of the straight body part was 12 mm, was produced.

After this, the residual powder layer 42 remaining between the graphite mould 52 and the fused crucible 40 was not removed, and when it was held inside the mould for 30 minutes, the fused crucible broke inside the mould, and therefore could not be used.

Comparative Example 3

First of all, the method described above was carried out using the device 20 shown in FIG. 4, and a fused crucible 40 of diameter 32 inches, in which the thickness of the straight body part was 16 mm, was produced. At this time, the crucible fusion conditions were set so that the thickness of the residual powder layer 42 was 2 mm. The thickness of the residual powder layer 42 of the straight body part was 2 mm.

After this, the fused crucible 40 was produced, and once the fused crucible 40 had been held inside the stainless-steel mould 24 for 10 minutes, it was extracted from the mould, cooled in the air, and the quartz glass crucible for pulling a silicon single crystal of Comparative Example 3 was obtained.

When the outermost and innermost fictive temperatures of the straight body part of the crucible of Comparative Example 3 were measured, the innermost fictive temperature was 1190° C., and the outermost fictive temperature was 1180° C., and the fictive temperature difference was 10° C.

The quartz glass crucible for pulling a silicon single crystal of Comparative Example 3 was inserted into the silicon single crystal production device shown in FIG. 6, 300 kg of silicon polycrystalline raw material was loaded into said crucible, and a silicon single crystal having a diameter of 300 mm was pulled. The results are shown in Table 1.

The effect of the present invention is clear from the preceding.

TABLE 1

|  | Diameter of crucible (inches) | Fictive temperature (° C.) | | Fictive temp. difference (° C.) | Mould | Temp. and cooling conditions | | Results |
|---|---|---|---|---|---|---|---|---|
|  |  | Straight body part, innermost side | Straight body part, outermost side |  |  | Outside of crucible | Inside of crucible |  |
| Ex. 1 | 24 | 1265 | 1210 | 55 | G | Approx. 40% of residual powder removed, held for 30 mins. inside mould | Cooled for 20 mins. with ultra-pure water and nitrogen gas | ◉ |
| Ex. 2 | 24 | 1235 | 1200 | 35 | G | Approx. 40% of residual powder removed, held for 30 mins. inside mould | None in particular (cooled in air) | ◯ |
| Comp Ex. 1 | 24 | 1245 | 1240 | 5 | G | Extracted immediately, cooled in air | None in particular (cooled in air) | X |
| Comp Ex. 2 | 24 | No measurement possible | No measurement possible | No measurement possible | G | Residual powder not removed, held for 30 mins. inside mould | None in particular (cooled in air) | X[1] |
| Ex. 3 | 32 | 1230 | 1150 | 80 | S | 4 mm residual powder layer remained, held for 30 mins. inside mould | Cooled for 30 mins. with ultra-pure water and air | ◉ |
| Ex. 4 | 32 | 1185 | 1145 | 40 | S | 5 mm residual powder layer remained, held for 30 mins. inside mould | None in particular (cooled in air) | ◯ |
| Comp Ex. 3 | 32 | 1190 | 1180 | 10 | S | 2 mm residual powder layer remained, held for 10 mins. inside mould, then extracted and cooled in air | None in particular (cooled in air) | X |

G Graphite mould
S Water-cooled stainless steel mould
The evaluation results are as follows:

◉ no deformation at all
◯ slight deformation was apparent, but there were no problems with the operation and the quality of the silicon single crystal
X deformation occureed which affected the operation and quality of the silicon single crystal.
X[1] broke in mould, could not be used FIG. 6 is a schematic of the device for producing a silicon single crystal into which the quartz glass crucible for pulling a silicon single crystal shown in FIG. 1 is inserted.

EXPLANATION OF SYMBOLS

10 quartz glass crucible for pulling a silicon single crystal
12 straight body part
14 bottom part
20 crucible production device
22 raw material supply means
24 metallic mould
26 arc electrode
28 heat barrier plate
30 high-temperature atmosphere
40 fused crucible
42 residual powder layer
50 crucible production device
52 graphite mould
54 air channel
56 air channel
58 air channel
60 multibranch pipe
62 multibranch pipe
64 multibranch pipe
66 rotary shaft
68 outlet flow channel
70 pump
80 silicon single crystal production device
82 carbon susceptor
84 main chamber
86 support shaft
88 heater
90 raw material melt
92 seed holder
94 seed crystal
96 wire
98 pulling chamber

The invention claimed is:

1. A quartz glass crucible for pulling a silicon single crystal, said quartz glass crucible comprising a straight body part and a bottom part, wherein the straight body part has a fictive temperature gradient wherein an innermost fictive temperature is set between 1185° C. and 1265° C., and an outermost fictive temperate is set between 1145° C. and 1210° C. respectively, and the outermost fictive temperature is at least 25° C. lower than the innermost fictive temperature.

2. The quartz glass crucible for pulling a silicon single crystal according to claim 1, in which the outermost fictive temperature is at least 50° C. lower than the innermost fictive temperature.

3. A method of producing a quartz glass crucible for pulling a silicon single crystal, said method comprising: fusing the crucible, then lowering an outside fictive temperature of the crucible by holding the crucible inside a mold and maintaining a temperature of the outside of the crucible for a prescribed period of time so as to form a fictive temperature gradient on at least a straight body part of the crucible, wherein an innermost fictive temperature is set between 1185° C. and 1265° C., and an outermost fictive temperature is set between 1145° C. and 1210° C. respectively, and the outermost fictive temperature of the straight both part is at least 25° C. lower than the innermost fictive temperature thereof.

4. The method of producing a quartz glass crucible for pulling a silicon single crystal according to claim 3, wherein the mold is a graphite mold, and after which a prescribed amount of residual powder is removed, and the temperature of the outside of the crucible is maintained for a prescribed period of time by residual heat from the graphite mold.

5. The method of producing a quartz glass crucible for pulling a silicon single crystal according to claim 3, wherein the mold is a metallic mold having an outside that is cooled with cooling water, and after the crucible has been fused a residual powder layer of at least 3 mm but not greater than 10 mm is left on at least the straight body part, wherein the residual powder is not removed, and the temperature of the outside of the crucible is maintained for a prescribed period of time by residual heat of said residual powder.

6. The method of producing a quartz glass crucible for pulling a silicon single crystal according to claim 3, wherein after the crucible is fused, said inside fictive temperature is raised by forced cooling of an inside of the crucible and the temperature of the outside of the crucible is maintained, so as to form the fictive temperature gradient on at least the straight both part, wherein the outermost fictive temperature is at least 25° C. lower than the innermost fictive temperature.

7. The method of producing a quartz glass crucible for pulling a silicon single crystal according to claim 6, in which the forced cooling is carried out by spraying gas and water with a resistance value of 17 MΩ·cm or more and no more than 50 particles having a size of 0.2 μm or more per ml.

8. The method of producing a quartz glass crucible for pulling a silicon single crystal according to claim 4, wherein after the crucible is fused, said inside fictive temperature is raised by forced cooling of an inside of the crucible and the temperature of the outside of the crucible is maintained, so as to form the fictive temperature gradient on at least the straight body part, wherein the outermost fictive temperature is at least 25° C. lower than the innermost fictive temperature.

9. The method of producing a quartz glass crucible for pulling a silicon single crystal according to claim 5, wherein after the crucible is fused, said inside fictive temperature is raised by forced cooling of an inside of the crucible and the temperature of the outside of the crucible is maintained, so as to form the fictive temperature gradient on at least the straight body part, wherein the outermost fictive temperature is at least 25° C. lower than the innermost fictive temperature.

* * * * *